United States Patent [19]
Tien

[11] 4,318,752
[45] Mar. 9, 1982

[54] HETEROJUNCTION SEMICONDUCTOR LASER FABRICATION UTILIZING LASER RADIATION

[75] Inventor: Ping K. Tien, Chatham Township, Morris County, N.J.

[73] Assignee: Bell Telephone Laboratories, Incorporated, Murray Hill, N.J.

[21] Appl. No.: 150,460

[22] Filed: May 16, 1980

[51] Int. Cl.³ .................. H01L 21/203; H01L 29/205; H01L 21/263
[52] U.S. Cl. ..................... 148/1.5; 148/187; 219/121 LF; 219/121 LH; 357/91; 427/53.1; 372/44
[58] Field of Search ............... 148/1.5, 18 T; 219/121 LF, 121 LH; 357/18, 91; 427/53.1

[56] References Cited
U.S. PATENT DOCUMENTS

| | | | |
|---|---|---|---|
| 3,424,890 | 1/1969 | Van Ruyven | 219/121 |
| 4,071,383 | 1/1978 | Nagata et al. | 148/175 |
| 4,078,164 | 3/1978 | Pelletier | 219/121 LH |
| 4,124,824 | 11/1978 | Dixon et al. | 331/94.5 H |
| 4,138,274 | 2/1979 | Dyment | 148/1.5 |
| 4,147,563 | 4/1979 | Narayan | 148/1.5 |
| 4,154,625 | 5/1979 | Golovchenko et al. | 148/1.5 |
| 4,176,325 | 11/1979 | Kajimura et al. | 331/94.5 H |
| 4,181,538 | 1/1980 | Narayan et al. | 148/1.5 |
| 4,190,809 | 2/1980 | Goodman et al. | 331/94.5 H |
| 4,230,505 | 10/1980 | Wu et al. | 148/1.5 |

OTHER PUBLICATIONS

Salathé et al. in 1979, IEEE/OSA Conference on Laser Eng. & Applications, Washington, D.C., Jun. 1979, p. 47.
Huber et al., Appl. Phys. Letts., 34 (1979), 858.
Inada et al., Jour. Appl. Phys., 50 (1979), 6000.
Pollack et al., Appl. Phys. Letts., 33 (1978), 314.
Narayan et al., Appl. Phys. Letts., 33 (1978), 338.
Wang et al., Appl. Phys. Letts., 33 (1978), 455.
White et al., Jour. Appl. Phys., 50 (1979), 3261.
Tsukada, J. Appl. Phys. 45 (1974), 4899.
Kobayashi et al., IEEE-J. Quantum Electronics, QE-13 (1977), 559.
Golovchenko et al., Appl. Phys. Letts., 32 (1978), 147.
Gat et al., Appl. Phys. Letts., 32 (1978), 276.

*Primary Examiner*—Upendra Roy
*Attorney, Agent, or Firm*—Michael B. Einschlag; Daniel D. Dubosky

[57] ABSTRACT

A stripe geometry is fabricated in a laser-diode structure having a plurality of epitaxial layers, including in tandem an undoped active semiconductor layer (3), a p-doped semiconductor layer (4), a moderately n-doped semiconductor layer (5) and a heavily p+-doped layer (6) by focusing laser radiation on the n-doped semiconductor layer (5). The laser radiation is chosen to have a wavelength which passes through the p+-doped layer (6) without absorption. When the laser radiation is absorbed in the n-doped layer, heat is generated which causes diffusion of p-dopant from the two adjacent layers to convert the exposed region to p-type. As the laser beam is scanned, a stripe having a forward pn junction for laser action is formed.

12 Claims, 2 Drawing Figures

HETEROJUNCTION SEMICONDUCTOR LASER FABRICATION UTILIZING LASER RADIATION

BACKGROUND OF THE INVENTION

This invention pertains to the field of semiconductor laser fabrication and more particularly to the application of laser radiation in said fabrication.

An article entitled "Unstable Horizontal Transverse Modes and Their Stabilization with a New Stripe Structure", *IEEE J. Quant. Elec.*, Vol. QE-13, No. 8, August 1977, pp. 659–661, by K. Kobayashi, R. Lang, H. Yonezu, Y. Matsumoto, T. Shinohara, I. Sakuma, T. Suzuki, and I. Hayashi discloses that the active region of a laser-diode has to form a channel waveguide not more than 5 microns wide for single-mode operation. In fact, as shown in an article entitled "GaAs-Ga$_{1-x}$Al$_x$As Buried-Heterostructure Injection Lasers", *J. Appl. Phys.*, Vol. 45, No. 11, November 1974, pp. 4899–4906 by T. Tsukoda, the best single-mode AlGaAs/GaAs laser-diode has a mesa type structure which is only about 1 micron wide. The mesa type of structure shown in the Tsukoda article and known by those skilled in the art as a buried structure requires a two-step growth process and is difficult to fabricate.

SUMMARY OF THE INVENTION

A stripe geometry is fabricated in a semiconductor structure having a plurality of epitaxial layers, said structure including in tandem a first p-doped semiconductor layer, a moderately n-doped semiconductor layer and a second p-doped layer, by focusing laser radiation on the n-doped semiconductor layer. The laser radiation is chosen to have a wavelength which passes through the second p-doped layer without absorption. When the laser radiation is absorbed in the n-doped layer, heat is generated which causes rapid diffusion of p-dopant from the two adjacent layers. This diffusion converts the n-doped layer to p-type in the region of absorption of the laser radiation. The laser beam may be focused to a spot the size of approximately 1 micron in diameter. When the beam is scanned across the structure, a thin stripe is formed which may be, for example, 1 micron wide.

In a first embodiment of the present invention, a laser beam is applied to a laser-diode structure having a plurality of epitaxial layers, said structure including in tandem an undoped active semiconductor layer, a p-doped semiconductor layer, a moderately n-doped semiconductor layer and a heavily doped p$^+$-doped cap layer, to form a striped region. In the striped region a forward p-n junction for laser action is formed. Outside the stripe the structure of the device is n-p-n-p$^+$, which structure is not conductive.

In a further embodiment of the process for forming a striped geometry in a laser-diode structure, the undoped active semiconductor layer is exposed to a second beam of laser radiation, which radiation is absorbed only in that active layer. This beam causes laser annealing of the active layer to provide a better lattice interface.

BRIEF DESCRIPTION OF THE DRAWING

A complete understanding of the present invention may be gained from a consideration of the detailed description presented hereinbelow in connection with the accompanying diagram in which.

DETAILED DESCRIPTION

A striped geometry is fabricated in a semiconductor structure having a plurality of epitaxial layers, said structure including in tandem a first p-doped semiconductor layer, a moderately n-doped semiconductor layer and a second p-doped semiconductor layer. Laser radiation having a wavelength which is absorbed in the n-doped semiconductor layer is focused to a size approximately equal to the desired stripe width. Radiation from the laser source is chosen so that it is not absorbed in the second p-doped semiconductor layer.

When the laser radiation is applied to the semiconductor structure, absorption in the n-doped semiconductor layer heats that layer to such an extent that p-dopant from the two adjacent layers rapidly diffuses into the n-doped semiconductor layer. This rapid diffusion of p-dopant converts the exposed region of the n-doped layer into p-type.

When the laser radiation is scanned across the semiconductor structure, a stripe is formed having a width equal to the diameter of the laser spot.

In a first embodiment of the present invention, a laser beam is applied to a laser-diode structure having a plurality of epitaxial layers, said structure including in tandem an undoped active semiconductor layer, a p-doped semiconductor layer, a moderately n-doped semiconductor layer and a heavily doped p$^+$-doped cap layer, to form a stripe region. In the striped region a forward p-n junction is formed, whereas outside the stripe, the structure is n-p-n-p$^+$ which is not conductive. This fabrication process is so simple that it does not require any photolithographic processes to form the stripe geometry. In fact, this method may be applied to many laser-diode structures simultaneously, as for example, when many diodes are to be processed on the same chip in the case of an integrated optic circuit.

In another embodiment of the present invention the above-described process is followed by the application of laser radiation from a second laser source. This second laser radiation is chosen so that it is absorbed in the active semiconductor layer. This application of a second beam of laser radiation causes laser annealing of the active layer in order to provide a better interface for the lasing p-n junction.

It is important to note that the laser radiation be applied to small volumes in the semiconductor layers in order that the vapor pressure generated in the volume not be so large as to shatter the diode structure.

Figure 1:
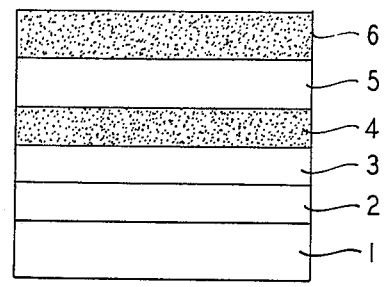
FIG. 1 shows, in pictorial form, a laser-diode structure before the application of radiation from a laser source.

FIG. 1 shows a specific example of a laser-diode structure before annealing. This structure comprises an n-InP substrate layer 1, n-InP buffer layer 2 ($\simeq 10$ μm thick), Ga$_{0.30}$In$_{0.70}$As$_{0.636}$P$_{0.364}$ active layer 3 ($\simeq 0.25$ μm thick) designed for emitting 1.3 micron radiation, p-Ga$_{0.171}$In$_{0.829}$As0.373P0.627 layer 4 ($\simeq 2$ μm thick) using either Cd or Zn as the dopant, 0.3 micron thick moderately doped n-Ga$_{0.171}$In$_{0.829}$As0.373P0.627 layer 5 and heavily doped p$^+$-InP layer 6 ($\simeq 0.5$ μm thick). The n-InP buffer layer 2 serves as one of the confinement layers in the double-heterostructure and is grown to provide a smooth surface for the interface between the substrate and the active layer. The p$^+$-InP cap layer 6 may be replaced by a p+quaternary cap layer to obtain a low resistance electrical contact.

The structure shown in FIG. 1 may be grown by liquid phase epitaxy from a combination of single- and two-phase solutions at temperatures near 635° C. using a graphite boat with a horizontal sliding substrate holder. The wells of the boat are capped during growth to reduce cross-contamination of the solutions. The fused-quartz reactor tube is arranged mechanically so that it can be inserted into or removed from a split horizontal furnace for rapid heating and cooling.

The solution constituents used for the growth of a 1.3 micron wavelength laser are given in Table 1 of an article entitled "Liquid Phase Epitaxial $In_{1-x}Ga_x$-$As_yP_{1-y}$ Lattice Matched to <100> InP Over the Complete Wavelength Range $0.92 \leq \lambda \leq 1.65$ μm", *Appl. Phys. Lett.*, Vol. 33, No. 4, Aug. 15, 1978, pp. 314–316 by M. A. Pollack, R. E. Nahory, J. C. DeWinter, and A. A. Ballman. The weights are relative to that of the 99.9999 percent pure In charge, which is ordinarily about 1.3 g. These In-Ga-As-P solutions are designed to produce layers lattice-matched to InP at the growth temperature. The undoped GaAs and InAs source materials are etched in Br:methanol prior to being accurately weighed. The growth procedure is initiated by loading all of the solution components except for the relatively volatile InP and Zn into the boat, and heating them at 675° C. for 16 hours in a Pd-purified $H_2$ ambient. Each time the reactor is opened to the atmosphere it is evacuated and flushed with $H_2$ for at least an hour before the heating cycle is started. After the 16 hour bake, the reactor is cooled to room temperature and flushed with $N_2$ before being opened to continue the loading procedure. The <100> InP substrates used for the lasers are cut from low dislocation density ($<10^4$ cm$^{-2}$) LEC-grown InP:S boules. The ~0.05 cm thick slices are diced to $0.75 \times 1.0$ cm$^2$ and lapped on both sides to a final thickness of ~0.025 cm. This lapping is performed on DEXILOSE paper using a 10 percent and then a 2.5 percent Br:methanol solution. Finally, the substrate is cleaned in a room temperature 3:1:1 Karo etch for 3 minutes, rinsed with distilled $H_2O$, dried with $N_2$, and placed in position in the boat. A polished InP plate is placed over the substrate (but not in contact with it) to reduce the thermal gas-etching which may damage its surface during the subsequent equilibration. At this time, the InP and Zn are added to complete the loading procedure.

The reaction tube, with loaded boat and flowing $H_2$, is placed in the furnace and rapidly reaches the equilibration temperature of 675° C. The reactor is kept at this temperature for one hour. Then a cooling rate of 0.7° C./minute is established by an electronic controller. At 660.5° C. the substrate is pushed under the "etchback" solution and held for 30 seconds. This solution is undersaturated by ~10° C. at this temperature and removes about 10 μm of gas-etched surface. The following In-P-Sn solution is supersaturated by ~7° C. at 660° C., and grows the flat InP:Sn buffer layer on which the following layers are grown. At 635.5° C., the active layer is grown for about 5–10 seconds, followed by the p-doped (doped with Zn or Cd) confinement layer down to 632° C., the n-doped layer and finally, the cap layer, which is grown for 10 seconds. After the wafer is pushed from under the last solution the reaction tube is removed from the furnace and cooled rapidly to room temperature.

The wafer is polished on the substrate side to a thickness of about 100 μm. Then Sn-Ni and Au are deposited and annealed to form the n-side electrical contact. The annealing temperature for the n-side for minimum electrical resistance was chosen to be 400° C.

Figure 2:
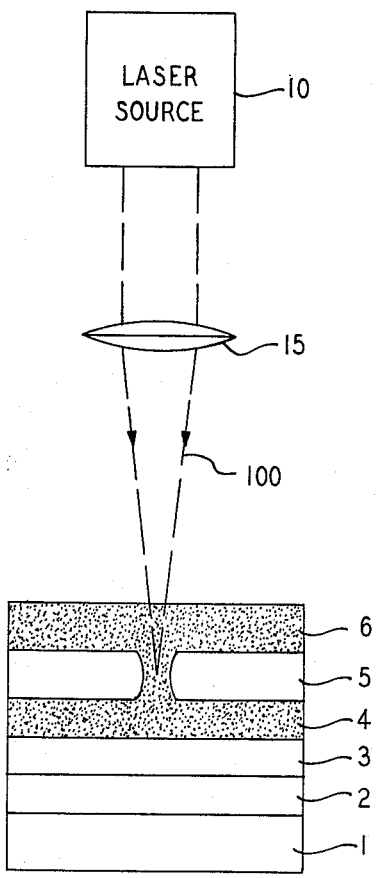
FIG. 2 shows, in pictorial form, an embodiment of the present invention which produces a striped geometry in the laser-diode structure of FIG. 1.

The next step in the process is that of forming a striped geometry in the laser structure shown in FIG. 1. FIG. 2 shows the application of laser beam 100 from laser source 10. The laser beam is focused by lens system 15 to a spot size of about 1 micron in diameter. We use the 1.06 micron radiation from a Q-switched Nd:YAG laser, which radiation is highly absorbing in $Ga_{0.171}In_{0.829}As_{0.373}P_{0.627}$. We note that caution must be exercised in that the laser beam be applied only in a volume that is typically less than $10^{-8}$ cm$^3$. This is required so that the vapor pressure generated in this volume does not shatter the diode structure.

During the application of the laser radiation, the heat generated in n-$Ga_{0.171}In_{0.829}As_{0.373}P_{0.627}$ layer 5 is sufficient to cause rapid diffusion of p-dopant from the two neighboring p-doped layers, 4 and 6, into layer 5 and to convert it into p-type. When the laser beam is scanned across the laser structure, we have a forward p-n junction for laser action, whereas outside the stripe the structure is n-n-p-n-p+, which structure is not conductive. We use one dose of 60 nanosecond, 2 J/cm$^2$ laser pulse at each volume along the stripe. Since the diffusion constant of Zn or Cd in a GaAs melt is larger than that of P in Si, the p-dopant in the p+ cap layer 6 and that in the p-doped layer 4 spreads into the n-doped layer 5 at a distance corresponding to 3 microns. This is more than sufficient to convert n-doped layer 5 into a p type.

It is understood that in order that the optical energy be absorbed by layer 5, the bandgap wavelength of layer 5 must be larger than the wavelength of the laser. The bandgap wavelengths, $\lambda_g$, of $In_{1-x}Ga_xAs_yP_{1-y}$ alloy compounds which are lattice-matched to InP have been measured. They are:

| x | y | $\lambda_g$ (in microns) |
|---|---|---|
| 0.000 | 0.000 | 0.920 |
| 0.083 | 0.155 | 1.005 |
| 0.171 | 0.373 | 1.125 |
| 0.226 | 0.472 | 1.176 |
| 0.250 | 0.531 | 1.225 |
| 0.275 | 0.585 | 1.275 |
| 0.300 | 0.636 | 1.298 |
| 0.305 | 0.658 | 1.343 |
| 0.358 | 0.790 | 1.452 |
| 0.406 | 0.880 | 1.513 |
| 0.475 | 1.000 | 1.650 |

The bandgap wavelength may also be computed from the following formula:

$$\lambda_g \text{(in microns)} = 1.24/(1.35 - 0.72y + 0.12y^2).$$

Thus for $y = 0.373$, $\lambda_g = 1.125$ microns, which wavelength is larger than the laser wavelength 1.06 microns. Therefore a compound having this value of y will absorb laser light. On the other hand InP has $\lambda_g = 0.920$ microns, which wavelength is smaller than a 1.06 micron laser wavelength and will therefore be transparent to the laser light. The laser light can only penetrate into the n- and then the p-$Ga_{0.171}In_{0.829}As_{0.373}P_{0.627}$ layers, layers 5 and 4 less than 1 micron in combined depth. Thus the laser energy will not reach the active layer.

This process may be followed, in a second embodiment of the invention, by the step of applying laser radiation from a second laser. This radiation is absorbed in active layer 3 of the device and anneals that layer. We apply 1.2 micron radiation from an F-center laser, which radiation is absorbing only in $Ga_{0.30}In_{0.70}As_{0.636}P_{0.364}$, which alloy has a $\lambda_g = 1.3$ micron. This step regrows the active layer to provide a better interface for the lasing pn junction.

A p-contact on a InGaAsP/InP laser diode comprising an Zn-Ni-Au alloy has a series resistance of about 1 ohm. This is about a factor of 10 higher than that achieved with the best AlGaAs/GaAs diodes. I use a process involving laser annealing to reduce the series resistance of the contact by approximately an order of magnitude. The process comprises the following steps:

(1) clean the laser diode in buffered HF, (2) etch the diode with citric acid and $H_2O_2$ to remove all remaining oxides from the surface, (3) plate a few hundred angstroms of Au with a type N bath (Autronix) (if the coating is not uniform remove it with a KI etch and repeat the cleaning procedure), (4) plate Zn in a Zn-plating bath comprising a solution of sodium cyanide:Zn:NaOH in proportions of 5.6:8.0:10.6 at a temperature between 70° and 75° F. using a current density of 20 mA/cm² for 40 seconds, (5) plate Au in a type N bath for a few minutes, (6) plate Au in a type CI bath at 60° C. to add a few mills, (7) sinter at 400°–500° C. for one minute, (8) apply a single 60 nanosecond 1.5 J/cm² pulse of laser radiation, and (9) plate gold to enhance bonding.

I claim:

1. A method of forming a p-doped selected area in an n-doped layer of a structure having a plurality of epitaxial layers on a substrate, said epitaxial layers including in tandem a first p-doped semiconductor layer (4), an n-doped semiconductor layer (5) and a second p-doped semiconductor layer (6), said method comprising:

focusing radiation from a laser source through said second p-doped semiconductor layer (6) and onto said selected area of said n-doped semiconductor layer (5) to provide heating of said area, which heating causes diffusion of p-dopant into selected area, whereby said selected area is converted to p-type, said radiation having a wavelength which is not absorbed by said second p-doped semiconductor layer.

2. A method of forming a stripe geometry in accordance with claim 1 which further includes the step of scanning said radiation along a stripe in said n-doped semiconductor layer (5).

3. A method of forming a p-doped selected area in a n-doped semiconductor layer of a laser-diode structure having a plurality of epitaxial layers on a substrate, said epitaxial layers including in tandem an undoped semiconductor layer (2) designed for emitting radiation of a predetermined wavelength, a p-doped semiconductor layer (4), a moderately n-doped semiconductor layer (5) and a heavily p+-doped semiconductor layer (6), said method comprising:

focusing radiation from a laser source through said p+-doped semiconductor layer (6) and onto said selected area of said n-doped seminconductor layer (5) to provide heating of said area, which heating causes diffusion of p-dopant into said selected area, whereby said selected area is converted to p-type, said radiation having a wavelength which is not absorbed by said p+-doped semiconductor layer (6).

4. A method of forming a stripe geometry in said laser-diode structure in accordance with claim 3, which further includes the step of scanning said radiation along a stripe in said n-doped semiconductor layer (5).

5. A method of forming a stripe geometry in a laser-diode structure as defined in claim 4 wherein said laser source is a Nd:YAG laser, for producing 1.06 micron radiation.

6. A method of forming a striped geometry in a laser-diode structure as defined in claim 5 wherein said radiation from said Nd:YAG laser having a pulse width of 60 nanoseconds and an energy density of 2 J/cm² is focused to a spot size having a 1 micron diameter.

7. A method of forming a striped geometry in a laser-diode structure as defined in claim 5 wherein said p+-doped semiconductor layer (6) is p+-InP.

8. A method of forming a striped geometry in a laser-diode structure as defined in claim 5 wherein said p+-doped semiconductor layer (6) is a p+ quaternary of the form $In_{1-x}Ga_xAs_yP_{1-y}$, x and y are chosen so that the bandgap wavelength of said quaternary is less than 1.06μ microns.

9. A method of forming a striped geometry in a laser-diode structure as defined in claim 7 wherein said p-doped semiconductor layer (4) and said n-doped semiconductor layer (5) are both quaternaries of the form $In_{1-x}Ga_xAs_yP_{1-y}$, x and y being chosen such that the bandgap wavelength of said quaternary is greater than 1.06μ microns.

10. A method of forming a striped geometry in a laser-diode structure as defined in claim 9, said method further comprising the step of focusing radiation from a second laser source onto said undoped semiconductor layer for annealing said layer, said radiation from said second source having a wavelength which is not absorbed by said p+-doped semiconductor layer (6), said n-doped semiconductor layer (5) and said p-doped semiconductor layer (4).

11. A method of forming a striped geometry in a laser-diode structure as defined in claim 10, wherein said second laser source comprises an F-center laser, for producing 1.2 micron radiation.

12. A method of forming a striped geometry in a laser-diode structure as defined in claim 11 wherein said p-doped layer (4) is p-$In_{0.829}Ga_{0.171}As_{0.373}P_{0.627}$, said n-doped layer (5) is n-$In_{0.829}Ga_{0.171}As_{0.373}P_{0.627}$ and said undoped semiconductor layer (3) is $In_{0.70}Ga_{0.30}As_{0.636}P_{0.364}$ which undoped semiconductor layer is absorbing to 1.2 micron radiation.

* * * * *